United States Patent [19]

Baertsch

[11] 4,126,852

[45] Nov. 21, 1978

[54] MULTIPLYING DIGITAL TO ANALOG CONVERTER

[75] Inventor: Richard D. Baertsch, Scotia, N.Y.

[73] Assignee: General Electric Company, Schenectady, N.Y.

[21] Appl. No.: 787,915

[22] Filed: Apr. 15, 1977

[51] Int. Cl.$^2$ ............................................. H03K 13/02
[52] U.S. Cl. ............................... 340/347 DA; 364/606
[58] Field of Search ............... 340/347 OA, 347 AD, 340/347 M; 307/221 D; 357/24; 364/606

[56] References Cited

U.S. PATENT DOCUMENTS

| 3,056,085 | 9/1962 | James | 340/347 AD |
|---|---|---|---|
| 3,836,906 | 9/1974 | Ando | 340/347 DA |
| 3,903,543 | 9/1975 | Smith | 340/347 DA |

OTHER PUBLICATIONS

MOK "Solid State Electronics," vol. 17, pp. 1147–1154, 1974.

Albarran "IEEE Journal of Solid-State Circuits," vol. SC-11, No. 5, Dec. 1976, pp. 772–779.

Primary Examiner—Charles D. Miller
Attorney, Agent, or Firm—Julius J. Zaskalicky; Joseph T. Cohen; Marvin Snyder

[57] ABSTRACT

A multiplying digital to analog converter providing a sequence of signal samples in which each sample represents the product of a respective sample of an analog input signal and a respective binary number is disclosed. The converter comprises a semiconductor device including a plurality of charge storage cells each paired with a respective digit of a binary number. The quantity of charge introduced into each of the storage regions is dependent on the sample of the analog signal and the presence of a "1" in the respective digit of the binary number. The product of the sample of the analog signal and the binary number is obtained by combining the charges so introduced into the storage regions.

5 Claims, 5 Drawing Figures

MULTIPLYING DIGITAL TO ANALOG CONVERTER

The present invention relates to a multiplying digital to analog converter for providing a sequence of signal samples in which each sample represents the product of a respective sample of an analog input signal and a respective binary number.

Such multiplying converters have been implemented heretofore by apparatus utilizing an array of precision resistors and a number of digital switches which determine whether or not current flows in a particular resistor. The currents flowing in all the resistors are then summed at a summing node of an operational amplifier. Such prior art multiplying converters are complex, costly and difficult to integrate on chip with MOS charge transfer devices.

Accordingly an object of the present invention is to provide multiplying digital to analog converters which are relatively simple and inexpensive.

Another object of the present invention is to provide multiplying digital to analog converters which are fast and accurate in performance.

Another object of the present invention is to provide multiplying digital to analog converters which provide an output in the form of quantities of charge which can be directly applied to other charge transfer devices for processing without requiring any additional interfacing circuits.

A further object of the present invention is to provide multiplying digital to analog converters which are capable of being integrated on chip with MOS charge transfer devices.

In carrying out the invention in one illustrative embodiment, there is provided a substrate of semiconductor material in which is located a plurality of first charge storage regions adjacent a major surface thereof. The first charge storage regions are consecutively arranged in a series according to the cross-sectional areas thereof as measured in a plane parallel to the major surface. The cross-sectional area of each storage region of the series starting with the second is twice the cross-sectional area of the preceding storage region of the series. A plurality of first storage electrodes are provided, each associated with a respective storage region. Each first storage electrode insulatingly overlies and is coextensive with a respective first charge storage region. A plurality of first surface adjacent portions are provided in the substrate, each conductively contiguous with a respective first charge storage region. A plurality of first control electrodes are provided, each associated with a respective first surface adjacent portion. Each first control electrode insulatingly overlies a respective first surface adjacent portion. The first storage regions are equal in number to the number of digits in a binary number. Each first storage region is paired with a respective digit of the binary number with the first storage region having the smallest cross-sectional area being paired with the least significant digit and each successive first storage region of increased cross-sectional area being paired with a respective successive digit of increased order. Means are provided for applying a first storage voltage to the first storage electrodes to establish a first level surface potential in the first storage regions. Means are provided for applying a first control voltage to the first control electrodes to establish a second level of surface potential in the first surface adjacent regions smaller in absolute magnitude than the first level of surface potential. Means are provided for applying an analog signal to one of the plurality of first storage electrodes and the plurality of the first control electrodes to vary one of the first and second levels of surface potential, while maintaining the other plurality of electrodes fixed in potential. Means are provided responsive to a "one" bit in each digit of the binary number to introduce a respective first quantity charge into a respective first storage region. Each first quantity of charge being proportional to the cross-sectional area of a respective first storage region and the difference of the first level of surface potential and the second level of surface potential. Means are provided for combining the first quantities of charge introduced into the first storage regions.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein;

Figure 1:
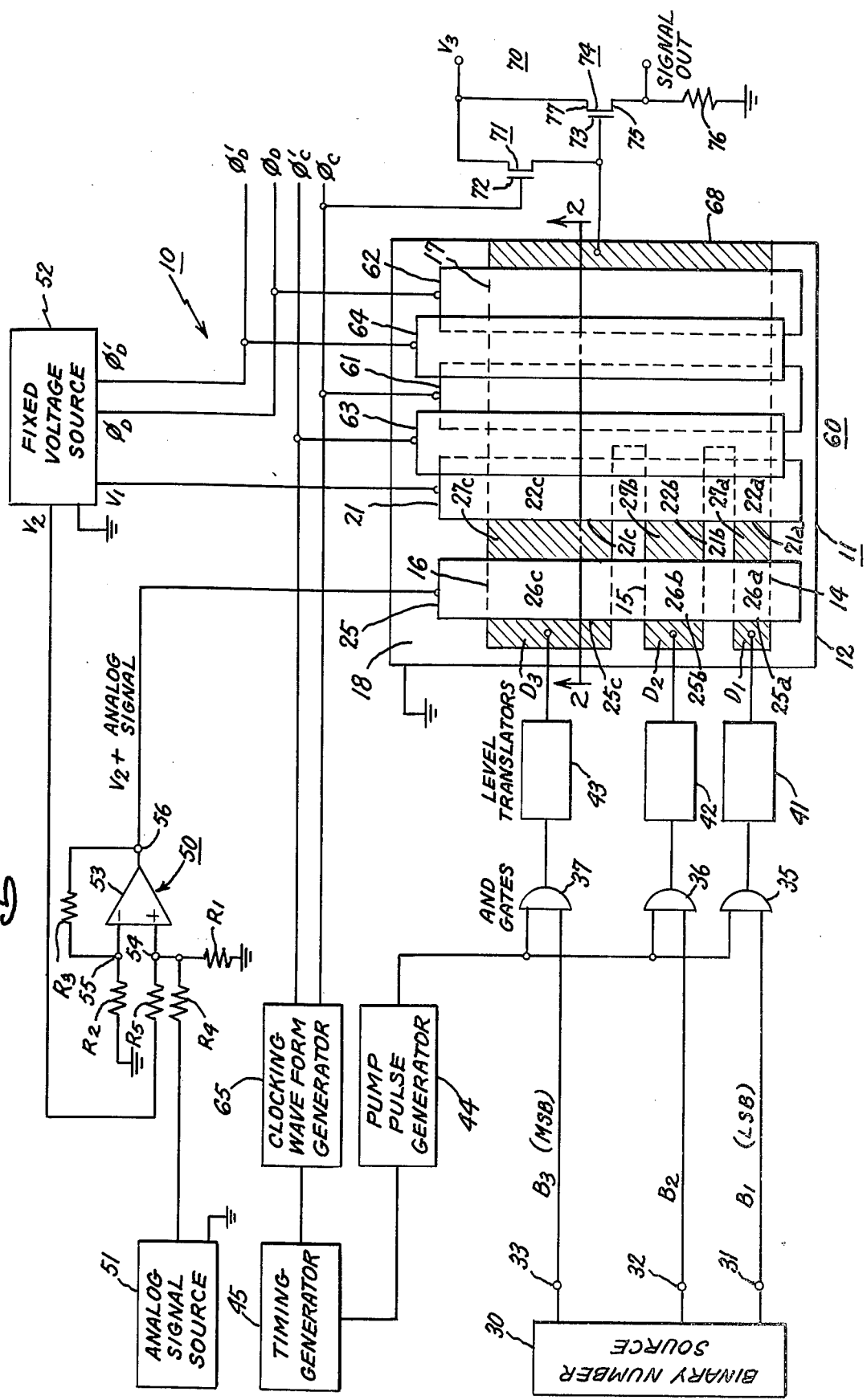
FIG. 1 is a diagram of one embodiment of a multiplying digital to analog converter incorporating a charge transfer device in accordance with the present invention.

Reference is made to FIG. 1 which shows apparatus 10 in accordance with the present invention for generating a sequence of signal samples in the form of packets of charge in which each such sample or packet of charge represents the product of a respective sample of an analog input signal and a respective binary number. The apparatus 10 comprises a charge transfer device 11 including a substrate 12 having a major surface 13. Conveniently, the substrate 12 is shown as of N-type conductivity. At the major surface 13 are provided a plurality of rectangular channel portions 14, 15 and 16, each of uniform but different widths. Channel portion 15 is twice the width of channel portion 14 and channel 16 is twice the width of channel portion 15. The three channel portions 14, 15 and 16 merge into a common channel portion 17 located on the right hand side of the device. A layer 18 of thick insulation which may conveniently be silicon dioxide is provided overlying the major surface 13 of the substrate. A plurality of generally rectangular recesses are provided in a thick insulating layer 18, each recess being in registry with a respective one of the channel regions 14, 15 and 16 and a recess in registry with the common channel region 17. Each of the recesses extends within a short distance of the major surface 13 of the semiconductor substrate 12 to provide a region of thin insulation lying thereover. Overlying the thick and thin portions of the insulating member and extending generally perpendicular to the long dimension of the recesses is a first conductive member or storage line 21. The portions of the storage line lying in the recesses or overlying the channel portions 14, 15 and 16 constitute first storage electrodes 21a, 21b and 21c respectively. The application of a negative potential of appropriate magnitude to the first storage line 21 with respect to the substrate will form first storage regions 22a, 22b, and 22c underlying the electrodes 21a, 21b and 21c respectively. As the length of the line 21 is substantially uniform the cross-sectional areas of the first storage region 22a, 22b and 22c underlying respectively first electrodes 21a, 21b and 21c as measured in a plane parallel to the major surface 13 forms a series in which cross-sectional area of each storage region of the series starting with the second is twice the cross-sectional area of the preceding storage region of the series.

Also overlying the thick and thin portions of the insulating member 18 and extending generally perpendicular to the long dimensions of the channel portions 14, 15 and 16 is a first control line 25. The portions of the control line lying in the recesses constitutes a plurality of first control electrode 25a, 25b, and 25c. The control line 25 is of uniform length along the long dimension of the channel portions 14, 15 and 16 and is spaced from and parallel to the first storage line 21. Each of the first control electrodes 25a, 25b, and 25c overlies a respective surface adjacent region 26a, 26b and 26c in the substrate. Region 27a of P-type conductivity is provided in the channel portion 14 contiguous to the first storage region 22a and the first surface portion 26a. Similarly, region 27b of P-type conductivity is provided in channel portion 15 contiguous to first storage region 22b and first surface adjacent portion 26b. Similarly, region 27c of P-type conductivity is provided in channel portion 16 between the first storage region 22c and the first adjacent portion 26c. A plurality of regions of P-type conductivity $D_1$, $D_2$ and $D_3$ are provided in channel portions 14, 15 and 16, respectively, and contiguous to surface adjacent portions 26a, 26b and 26c, respectively, to provide a source of minority carrier charge for the device.

Figure 3:
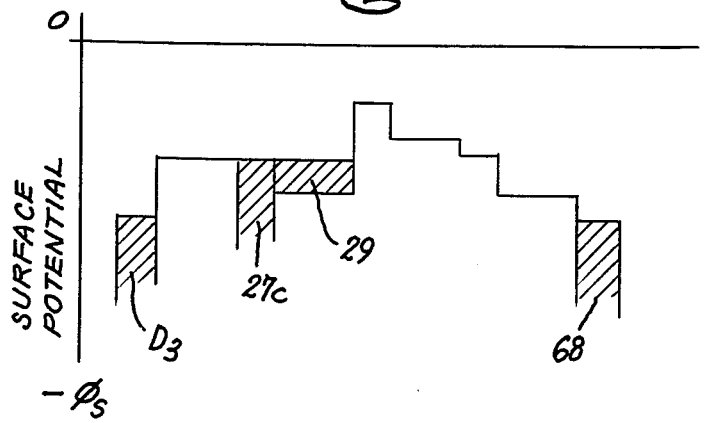
FIG. 3 is a diagram of semiconductor surface potential versus distance along the semiconductor surface of the charge transfer device of FIG. 2 useful in explaining the manner in which quantities of charge or packets are formed in the charge transfer device in accordance with the present invention.

Assume that a first storage voltage such as $V_1$ is applied to the first storage electrodes 22a thru 22c to establish a first fixed surface potential in the first storage regions 22a thru 22c. Assume that a second fixed voltage $V_2$ plus an analog signal is applied to the first control electrodes 25a thru 25c to establish a first variable surface potential in the first surface adjacent portions 26a thru 26c of the substrate. Assume that the voltage $V_1$ is a negative voltage and assume that the voltage $V_2$ plus the analog signal is also a net negative voltage which is smaller in absolute magnitude than the voltage $V_1$ so that the surface potential underlying the first surface adjacent portions 26a thru 26c is smaller in absolute magnitude than the fixed potentials of the storage regions 22a thru 22c. If the charge source region $D_1$ is pulsed so as to raise the potential thereof above the surface potential of the surface adjacent region 26a, minority carrier charge is caused to flow from the source region $D_1$ through the surface adjacent region 26c and the conductive region 27a into the first storage region 22a underlying the electrode 21a. With a pulse of long enough duration the storage region 22a is filled with charge and any excess charge is caused to spill back to the source region $D_1$ after its potential is dropped below the potential of the surface adjacent region 26a. Thus, a first quantity of charge is formed in the first charge storage region 22a, which is proportional to the cross-sectional area of the first storage region 22c and the difference in potential of the first fixed surface potential and the first variable surface potential. The packet of charge is proportional to a sample of the analog signal as the voltages $V_1$ and $V_2$ are constant and the cross-sectional area of the storage region is constant. The particular sample of the analog signal taken is the sample at the time when the charge source region $D_1$ is lowered in potential below the potential of the surface adjacent portion 26a. If at the same time the charge source region $D_2$ were to be pulsed in the same manner as the pulsing of the charge source region $D_1$ another quantity of charge would be introduced into the storage region 22b which would also be proportional to the cross-sectional area of the first storage region 22b and to the difference of potential of the first fixed surface potential $V_1$ and the first variable surface potential $V_2$, however, in this case the quantity of charge would be twice the quantity of charge included in the storage region 22a. Similarly, were the charge source region $D_3$ to be pulsed in the manner of pulsing charge source regions $D_1$ and $D_2$, a quantity of charge would be introduced into the storage region 22c which would also be proportional to the cross-sectional area of the first storage region 22c and the difference of the first fixed surface potential and the first variable surface potential. However, in this case the quantity of charge would be twice the quantity of charge included in the storage region 22b. This quantity of charge is shown in FIG. 3 as packet of charge 29. Thus, if the charge source regions $D_1$ and $D_2$ and $D_3$ were paired with three digits $B_1$, $B_2$, and $B_3$ of a binary number in which $D_1$ is paired with $B_1$, the least significant bit, $D_2$ is paired with $B_2$, the next most significant bit, and $D_3$ is paired with $D_3$, the most significant, and if each of the regions $D_1$, $D_2$ and $D_3$ is pulsed in the manner described when a "one" bit occurs in a respective digit of the binary number and not pulsed when a zero occurs in the digit, the sum of the quantities of charge introduced into the first storage regions 22a, 22b and 22c would be proportional to the binary number times the sample of the analog signal.

Binary numbers for operation of the apparatus are provided by a binary number source 30 including three output terminals 31, 32 and 33 on which appear, respectively, as digits $B_1$, $B_2$ and $B_3$ with digit $B_1$ being the least significant and digit $B_3$ being the most significant. When the voltage level at one of the terminals is low, the digit or bit has a value of zero. When the voltage level on a terminal is high, the bit has a value of one. A plurality of AND gates 35, 36 and 37 are provided, each having a pair of input terminals and an output terminal. Also, a plurality of level translators 41, 42 and 43 are provided. The level translators are amplifiers for converting the voltage level appearing at the output of the AND gates 35–37 to negative values suitable for driving the source regions $D_1$, $D_2$ and $D_3$ in the manner described above. Terminal 31 of the binary number source 30 is connected to one of the input terminals of AND gate 35, the output of which is connected through level translator 41 to the charge source region $D_1$. Similarly, terminal 32 is connected to the input terminal of AND gate 36, the output terminal of which is connected through level translator 42 to charge source $D_2$. The output terminal 33 is connected to the input terminal of AND gate 37, the output of which is connected through level translator 43 to the charge source region $D_3$. The other input terminals of the AND gates 35, 36 and 37 are connected to the output of the pump pulse generator 44 which in turn is controlled by the timing generator 45. The pump pulse generator 44 provides the positive going timing pulses to one of the inputs of each of the AND gates 35, 36 and 37. If a "one" appears at one of the terminals 31, 32 and 33 at the time of occurrence of a pulse from generator 44, an output is obtained from the corresponding AND gate, the level of which is translated by the corresponding level translator, and causes a corresponding source region to be pumped to provide charge to a corresponding first charge storage region, as described above. If a zero or low level appears on one of the terminals 31, 32 and 33, no output is provided by the corresponding AND gate and consequently the corresponding charge source region is not pulsed but remains at a negative potential and the charge storage region associated therewith does not receive any charge. Thus, a means has been provided for filling with charge a first charge storage region paired with a particular bit of a binary number when a "one" appears in a digit and for leaving a first charge storage region empty when a "zero" bit appears in that digit.

The voltage $V_2$ plus the analog signal applied to the first control line 25, and hence also to the first control electrodes 25a, 25b and 25c, is obtained from an amplifier 50 which has unity gain. The analog signal is obtained from an analog signal source 51 and the fixed voltage $V_2$ is obtained from a fixed voltage source 52. The amplifier 50 comprises a differential amplifier 53 having a noninverting terminal 54, an inverting terminal 55 and an output terminal 56. Resistor $R_1$ is connected between the noninverting terminal 54 and ground, resistor $R_2$ is connected between the inverting terminal 55 and ground, and feedback resistor $R_3$ is connected between the inverting terminal 55 and the output terminal 56. The analog signal source 51 is connected to the noninverting terminal 54 through resistor $R_4$. Bias voltage $V_2$ from a fixed voltage source 52 is connected to the noninverting terminal 54 through a resistor $R_5$. With resistors $R_1$, $R_3$, $R_4$ and $R_5$ equal to R and resistor $R_2$ equal to R/2, amplifier 50 has unity gain. This characteristic is readily apparent from the circuit requirement that the voltage on the inverting terminal 55 be equal to the voltage on the noninverting terminal 54. For this requirement to be met the voltage of the output terminal 56 must equal $V_2$ plus the analog signal, provided the resistors are chosen as above.

Figure 4:
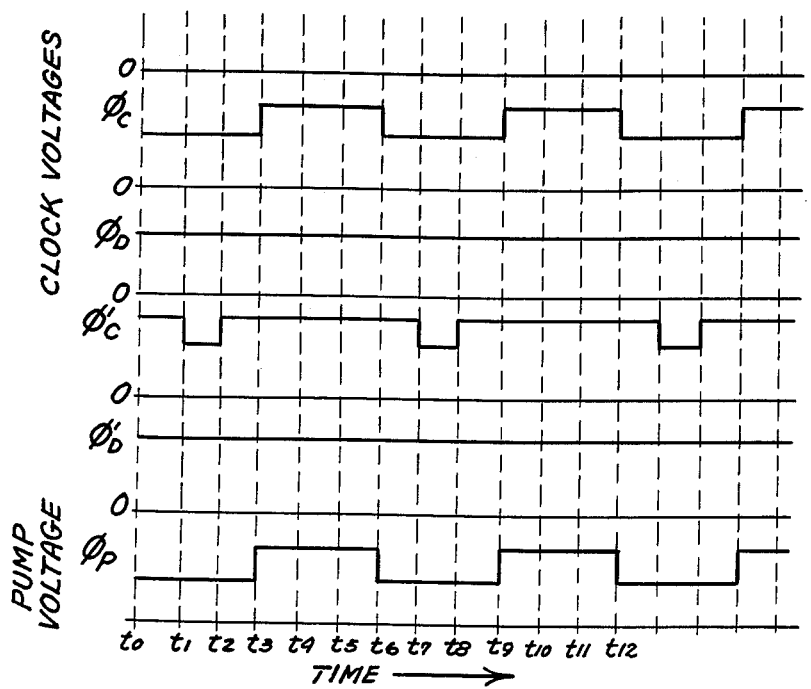
FIG. 4 is a diagram of voltage waveforms useful in explaining the operation of the multiplying digital to analog converters of FIGS. 1 and 5.

The first quantities of charge introduced into the first charge storage regions 22a, 22b and 22c are combined in a common storage region of a single stage of a single phase charge transfer shift register 60. The shift register 60 comprises a pair of storage electrodes 61 and 62. Storage electrode 61 extends over the recess overlying the common channel portion 17 of the substrate 12 generally parallel to the first storage electrode line 21 and adjacent to the channel regions 14, 15 and 16. Similarly, the storage electrode 62 extends over the common channel portion 17 adjacent to and spaced from the storage electrode 61. A transfer electrode 63 insulatingly overlies adjacent edges of the first storage electrode 21 and storage electrode 61. Another transfer electrode 64 insulatingly overlies adjacent edges of storage electrodes 61 and 62. Storage electrode 61 is connected to a source of $\phi_C$ voltage, transfer electrode 63 is connected to a source of $\phi_C'$ voltage, storage electrode 62 is connected to a source of fixed voltage $\phi_D$, and transfer electrode 64 is connected to a source of fixed voltage $\phi_D'$. Voltages $\phi_C$ and $\phi_C'$ are provided by clocking waveform generator 65 under the control of timing generator 45. Fixed voltages $\phi_D$ and $\phi_D'$ are provided by fixed voltage source 52. The voltage waveforms $\phi_C$, $\phi_D$, $\phi_C'$ and $\phi_D'$ are shown in FIG. 4. Also, shown in FIG. 4 is the pulse source voltage $\phi_P$ applied to charge sources $D_1$, $D_2$ and $D_3$.

Figure 2:
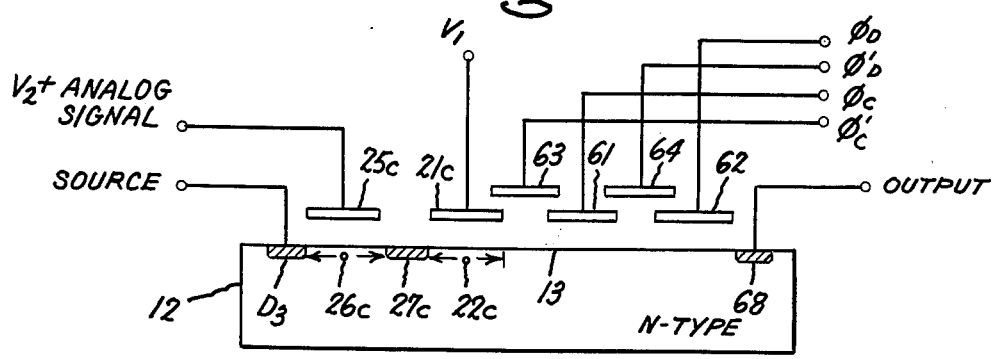
FIG. 2 shows a sectional view of the charge transfer device of FIG. 1 taken along section lines 2—2 of FIG. 1.

The manner in which the first quantities of charge are introduced or formed in the first storage regions 22a–22c, and the manner in which they are clocked out into a common storage region underlying storage electrode 61 will now be explained in connection with FIGS. 2, 3 and 4. During the time interval $t_3$ through $t_6$ the pump source voltage $\phi_P$ applied to source $D_3$ is high causing charge to flow into the storage region 22c. The storage region is overfilled as the most positive level of $\phi_P$ voltage is more positive than the surface potential appearing at the surface adjacent portion 26c of the substrate underlying electrode 25c. During the period of time $t_6$ through $t_7$ after the $\phi_P$ voltage has dropped in level, the excess charge in the first storage region 22c spills back into the source region $D_3$ over the potential dam provided by the surface adjacent portion 26c. Thus, a first quantity 29 or packet of charge is provided in the first storage region 22c. FIG. 3 shows the variation in surface potential in the most significant bit channel 16 of the semiconductor substrate at a time interval between $t_6$ and $t_7$ after excess charge has spilled out of the first storage region 22c. During the period $t_6$ through $t_9$, the $\phi_C$ voltage drops from its high level to its low level enabling charge to be transferred to the storage region underlying electrode 61 from the storage region 22c when the transfer gate or electrode 63 is lowered in potential. The latter condition occurs during the time interval $t_7$ through $t_8$. During this interval the packet of charge 29 is transferred to the storage region underlying storage electrode 61. In similar fashion first quantities of charge formed in the first storage regions 22a and 22b are transferred to the common storage region underlying storage electrode 61 where the charges commingles and become one quantity of charge representing the product of a binary number and a sample level of an analog signal. During the interval $t_9$ through $t_{12}$ charge accummulated in the storage region underlying electrode 61 is transferred to the storage region under electrode 62. Readout of the charge is obtained by the provision of a region 68 of P-type conductivity in the common channel portion 17 of the N-type substrate. Readout is accomplished by precharging the region 68 of opposite conductivity type 68 and floating it prior to the transfer of charge to the storage region underlying electrode 62. On occurrence of the transfer of charge from the storage region underlying electrode 61 to the storage region underlying electrode 62 charge flows into the floated region 68 and alters its potential which then may be readily sensed by a circuit such as precharge and float circuit 70.

The charge flowing onto the region 68 during the interval $t_9$ through $t_{12}$ is sensed by a precharge and float circuit 70. The precharge and float circuit 70 comprises a transistor 71 having its source to drain conduction path connected between the region 68 and the source of precharge potential $V_3$. The gate 72 of the transistor 71 is connected to a $\phi_C$ voltage line. Voltage $V_3$ is set to lie below the surface potential of the empty storage region underlying electrode 62. Thus, when the $\phi_C$ storage site of the shift register 60 is receiving charge the transistor 71 is turned on and a precharge voltage is applied to the region 68. During the next period of the clock cycle when charge is transferring from under the $\phi_C$ electrode 61 to the $\phi_D$ electrode 62, the storage region underlying the $\phi_C$ electrode 61 rises in potential and enables charge to flow into the region 68 and to alter the potential of region 68 in accordance with the magnitude of the charge transferred. Change in voltage on the region 68 is applied to gate 73 of transistor 74 connected as a source follower in which the source 75 is connected through a source resistance 76 to ground and the drain 77 is connected to the source of precharge voltage $V_3$. A voltage proportional to the packet of charge delivered to the precharged and floated P-type region 68 appears across the source resistance 76.

While the charge packet representing the product of a binary number and a sample of an analog signal is sensed as a voltage sample, the packet of charge could be retained as charge by the provision of additional stages in shift register 60 and clocked into other devices, such as transversal filters and multipliers, and processed therein, as desired.

Figure 5:
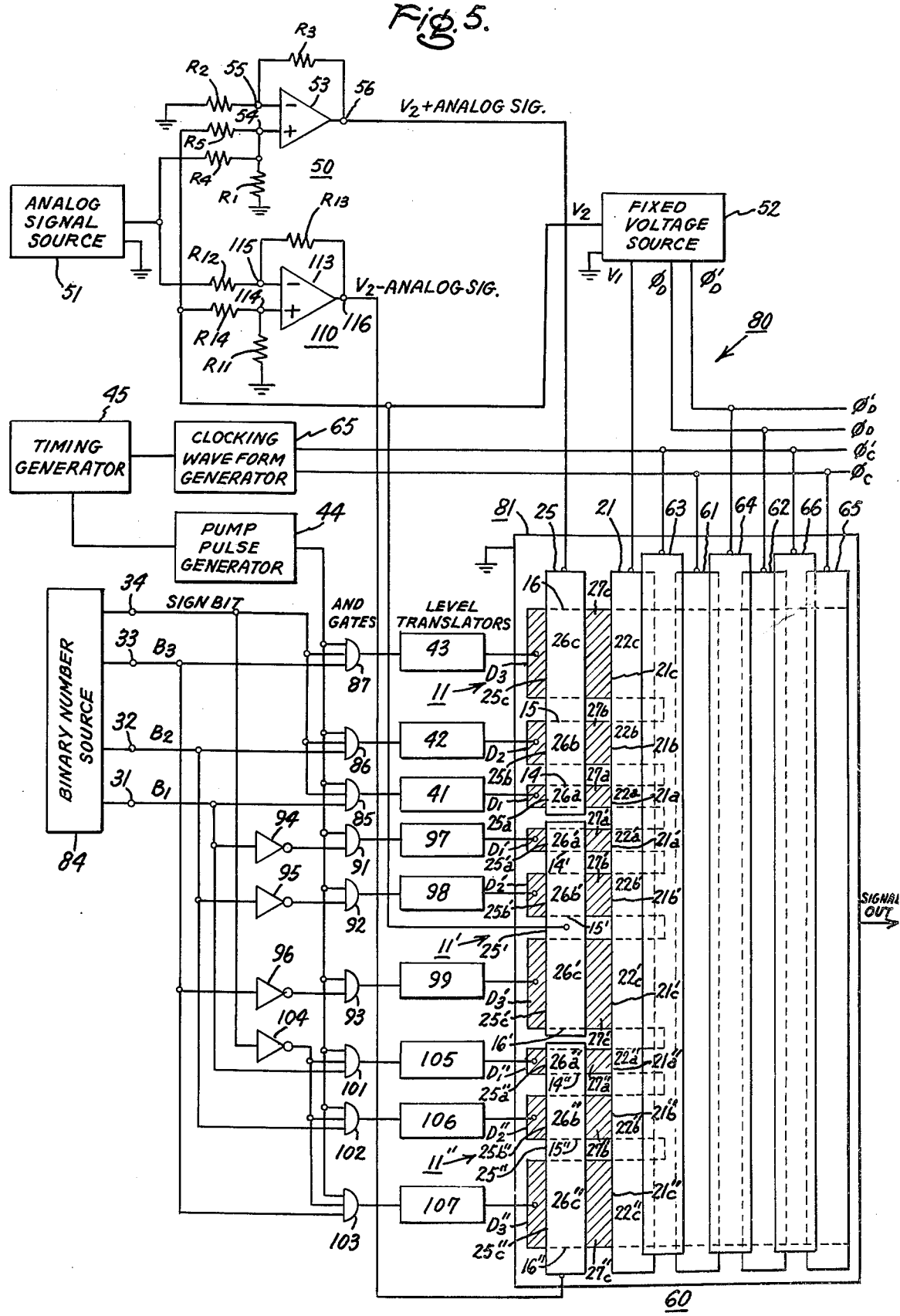
FIG. 5 is a schematic diagram of a four quadrant multiplying digital to analog converter in accordance with the present invention.

In the multiplying digital to analog converter apparatus 10 of FIG. 1 only positive values of the analog signal and positive binary numbers could be multiplied to obtain a resultant product. Such multiplying digital to analog converters are referred to as single quadrant converters. To increase the utility and application of the multiplying converters it is desirable that both the analog signal as well as the binary numbers be permitted to have negative as well as positive values. Such multiplying converters are referred to as four quadrant converters. The apparatus 80 of FIG. 5 provides four quadrant multiplication in accordance with the present invention. The elements of the apparatus of FIG. 5 identical to the elements of apparatus of FIG. 1 are identically designated. The four quadrant apparatus 80 comprises a charge transfer device 81 which includes three single quadrant devices such as shown in FIG. 1. The devices are formed on a common substrate and will be referred to as devices 11, 11' and 11". The devices are identically constituted. The elements of devices 11' and 11" corresponding to elements of device 11 are identically designated and single primed for the device 11' and double primed for the device 11". Device 11' includes rectangular channel regions 14', 15' and 16', each of identical width to a respective one of channel regions 14, 15 and 16 of device 11. Similarly, device 11' has rectangular channel regions 14", 15" and 16", each of identical width to the correspondingly numbered channel region of device 11. The channel regions of each of the devices 11, 11' and 11" open into a common enlarged channel region 17. Storage electrodes 61, 62 and 65 extend over the entire width of the enlarged common channel portions 17. The transfer electrodes 63, 64 and 66 also extend over the entire width of the common channel region 17. Storage electrode 61 energized with a $\phi_C$ voltage provides a storage region underlying the electrode 60 which is the common output storage region for each of the devices 11, 11' and 11". The conductive source line 21 extends over the rectangular channels of all the devices 11, 11' and 11". Portions of the storage line 21 lying over portions 14', 15' and 16' are referred to, respectively, as second storage electrodes 21a', 21b' and 21c'. The storage regions underlying these second storage electrodes are referred to as second storage regions 22a', 22b' and 22c', respectively. Portions of the line 21 lying over the channel regions 14", 15" and 16" of device 11" are referred to as third storage electrodes and are designated as 21a", 21b" and 21c". The storage regions underlying these third storage electrodes are referred to as third storage regions 22a", 22b" and 22c", respectively. The portions of the line 25' of device 11' overlying channel regions 14', 15' and 16' are designated as control electrodes and are respectively 25a', 25b' and 25c'. Regions underlying these electrodes are designated 26a', 26b' and 26c', respectively, and are referred to as the second surface adjacent portions of the substrate. Line 25' and hence the second control electrodes are connected to the fixed voltage $V_2$ of source 52. The portions of the conductive line 25" of device 11" overlying the channel portions 14", 15" and 16" are referred to as third control electrodes and are designated respectively 25a", 25b" and 25c". Surface adjacent portions of the substrate underlying these third control electrodes are referred to as third surface adjacent portions and are designated 26a", 26b" and 26c". The third control electrodes of line 25" are connected to the output of an inverting amplifier 110 which supplies a voltage $V_2$ minus the analog signal to the converter. Amplifier 110 will be described further below.

The device 11' is provided with conducting regions of P-type conductivity type 27a', 27b' and 27c' identical to conducting regions 27a, 27b, and 27c of device 11. Device 11' is provided with regions of P-type conductivity referred to as source regions $D_1'$, $D_2'$ and $D_3'$ identical to regions $D_1$, $D_2$ and $D_3$ of device 11. Device 11" is provided with conducting regions of P-type conductivity 27a", 27b" and 27c" identical to conducting regions 27a, 27b, and 27c of device 11. Device 11" is provided with regions of P-type conductivity $D_1"$, $D_2"$ and $D_3"$ identical to regions $D_1$, $D_2$ and $D_3$ of device 11. Binary number source 84 is identical to the binary number source 30 of FIG. 1 except that it includes an additional output terminal 34 on which appears the sign bit. AND gates 85, 86 and 87 are identical to AND gates 35, 36 and 37 of FIG. 1 except that an additional input terminal is provided for each of these devices which is connected to the sign bit terminal 34. Conveniently, when a plus sign appears on terminal 34 corresponding to a high voltage level AND gates 85, 86 and 87 are enabled, and hence the device 11 is enabled to provide a quantity of charge proportional to the magnitude of the binary number represented by the bits appearing on terminals 31, 32 and 33. If the sign bit appearing on terminal 34 is negative corresponding to a low level of voltage, device 11 cannot provide charge. AND gates 91, 92 and 93 each having a pair of input terminals and an output terminal is provided for controlling the input to device 11'. Inverters 94 and 95 and 96 are provided for control of the operation of the device 11'. Translators 97, 98 and 99 are also provided for controlling the operation of the device 11'. Terminal 31 of the binary number source 84 is connected through the inverter 94 to one of the input terminals of the AND gate 91, the output terminal of which supplies a voltage waveform through the level translator 97 to the charge source $D_1'$. Terminal 32 of the binary number source 84 is connected through inverter 95 to one input terminal of AND gate 92, the output of which is connected through level translator 98 to charge source $D_2'$. Also terminal 33 of the binary number source 84 is connected through inverter 96 to one input terminal of AND gate 93, the output of which is supplied through level translator 99 to charge source $D_3'$. All of the other input terminals of AND gates 91, 92 and 93 are connected to the output of the pump pulse generator 44. Thus, whenever a one bit appears on the terminals 31, 32 and 33 in conjunction with an appearance of an output from the pump pulse generator 44, an output appears at the output terminal of the AND gates and causes a quantity of charge to be introduced into the second storage regions 22a', 22b' and 22c' of the second device 11' which is proportional to the cross-sectional area of the second storage region and the difference of a first fixed level of surface potential set by voltage $V_1$ and a second fixed level of surface potential set by voltage $V_2$.

AND gates 101, 102 and 103, each having three input terminals and an output terminal, are provided for controlling the third device 11". One of the input terminals of each of the devices 101 through 103 is connected to the output of the pump pulse generator 44. The second input terminal of each of the AND gates 101 through 103 is connected to the output of an inverter 104, the input of which is connected to the sign bit terminal 34. The third input terminal of each of the devices 101 through 103 is connected to a respective one of the terminals 31, 32 and 33. The outputs of the AND gates 101 through 103 are connected through level translators 105 through 107, respectively, to charge sources $D_1''$, $D_2''$ and $D_3''$, respectively. As the sign bit terminal 34 is connected to the inputs of AND gates 101 through 103 through an inverter 104, the device 11" is enabled when the sign bit appearing on terminal 34 is negative or low and is disenabled when the sign bit appearing on the terminal is positive or high. Thus, devices 11 and 11" are operated in the alternative. When the sign bit appearing on terminal 34 is positive, and hence high, device 11 is operative and the device 11" is inoperative. Conversely, when the sign bit appearing on terminal 34 is negative and low in voltage, the device 11" is operative and the device 11 is inoperative.

The voltage $V_2$ minus the analog signal applied to the third control line 25" is obtained from inverting amplifier 110. Inverting amplifier 110 includes a differential amplifier 113 having a noninverting terminal 114, an inverting terminal 115, and an output terminal 116. Resistor $R_{11}$ is connected between terminal 114 and ground. Resistor $R_{12}$ is connected between terminal 115 and the analog signal source 51. Resistor $R_{13}$ is connected between the inverting terminal 115 and the output terminal 116. A coupling resistor $R_{14}$ is connected between the noninverting terminal 114 and the source 52 of fixed voltage $V_2$. With resistors $R_{11}$ through $R_{14}$ equal both the dc component of voltage $V_2$ applied to the noninverting terminal 114 and the analog signal voltage applied to the inverting terminal 115 are amplified with unity gain. However, the analog signal is inverted resulting in a net voltage output represented by $V_2$ minus the analog signal.

The operation of the multiplying digital to analog converter 80 of FIG. 5 will now be explained or described for each of four conditions of operation. In the first condition a positive binary number is multiplied by a positive sample or level of an analog signal. In the second condition a positive binary number is multiplied by a negative sample of an analog signal. In the third condition a negative binary number is multiplied by a positive sample of an analog signal. In the fourth condition a negative binary number is multiplied by a negative sample of an analog signal.

In the operation of the convertor 80 the bias voltage $V_1$ is set larger in absolute magnitude than voltage $V_2$ to provide fixed quantities of bias charges in each of the three channels of the three devices 11, 11', and 11" under appropriate conditions of operation. In order to represent negative products utilizing relative quantities of charge in an output storage region it is necessary to represent a zero value of product as corresponding to a certain quantity of bias charge.

For the first condition enumerated above, device 11 would be activated or enabled and charge would be provided in each of the first storage regions 22a, 22b and 22c for those regions paired with a one bit in the applied binary number. For those storage regions paired with a zero bit in the binary number no charge would be provided. In order to maintain constant bias charge in the combined output of the device 11, it is necessary to supply the deficient component of bias charge resulting from the occurrence of a zero in a digit of the binary number. By activating the corresponding storage region in device 11', a constant bias charge is maintained. For example, if bit $B_2$ on terminal 32 is low, the inverse of the bit $B_2$ is high. Accordingly, the source region $D_2'$ of device 11' is activated to supply charge to the storage region 22b' which represents the component of bias charge deleted from the storage region in 22b of device 11.

For the second condition of operation, as the analog signal sample is negative it subtracts from the constant voltage level $V_2$ to cause a reduced quantity of charge to be supplied to the first storage regions 22a, 22b and 22c when, of course, the bits of the binary number associated with these storage regions are ones. Thus, for conditions one and two enumerated above devices 11 and 11' are operative and device 11" is inoperative. When the binary number is zero and the analog signal is of zero amplitude, the total charge supplied in the storage region underlying electrode 61 is the sum of the charges introduced into the first and second storage regions of the devices 11 and 11' and is equal to a certain fixed quantity of bias charge. For positive values of analog signal, the sum of the quantities of charge introduced into the first and second storage regions of the first and second devices 11 and 11' increases in accordance with the value of the analog signal and the value of the binary number. For negative samples of the analog signal the total charge introduced into the first and second storage regions decreases the increasing negative level of the analog signal from the value of bias charge corresponding to zero value of analog signal.

For conditions three and four enumerated above, devices 11" and 11' are utilized and device 11 is inoperative. For a negative number, the level of the sign bit is low thus rendering the output of AND gates 85 through 87 inactive. The low level of the sign bit is inverted by the inverter 104 and the AND gates 101 through 103 associated with device 11" are activated to provide charge proportional to the binary number and the analog signal. Supplying the third control electrode 25" with a voltage equal to $V_2$ minus the analog signal provides the desired output quantity of charge. Device 11' complements the device 11" to provide quantities of bias charge deleted in the operation of the device 11" by the occurrence of a zero bit with a particular third storage region, as explained in connection with the device 11.

Thus, under the operation of the clocking waveforms applied to the storage electrodes 61, 62 and 65 and the charge transfer electrodes 63, 64 and 66, the charges introduced into the various first storage regions, second storage regions and third storage regions are appropriately clocked into the storage region underlying electrode 61 where they are combined to provide a quantity of charge which is proportional to the product of the binary number and the level of the analog signal. The analog signal is periodically varying about a zero level. The The binary number source provides a plurality of binary numbers, each represented by number bits and a sign bit on the lines 31 through 34 to produce in succession in the storage regions 61 total quantities of charge representing the product of a binary number and a corresponding analog signal sample. The quantities of charges are clocked from stage to stage in synchronism with the clocking waveforms from generator. Charge appearing in the storage region underlying electrode 61 may be clocked to other charge transfer devices, such as transversal filters and multipliers by providing suitable shift registers stages. Signals may also be obtained by clocking the charges into a region of opposite conductivity, such as region 68 of FIG. 1, where they are sensed as voltage samples.

While the multiplying digital to analog convertor 80 of FIG. 5 is a four quadrant converter, it is readily apparent that it could be operated as a two quadrant converter, if desired, by utilization of just devices 11 and 11' of the apparatus.

While a particular "fill and spill" charge packet generation assembly is shown and described for the devices 11, 11', and 11" of the apparatus of FIGS. 1 and 5, it will be understood other charge packet generation assemblies may be utilized. For example, the conductivity coupled regions, such as region 27c of FIG. 2, could be eliminated by overlapping the storage electrodes with the control electrodes in each of the devices. Also, in this connection the analog signal could as well be applied to the storage electrodes with the control electrodes having the fixed voltage $V_1$ applied thereto.

While the invention has been described in connection with multiplying digital to analog converters adapted to multiply with binary numbers of three bits or digits, it is apparent that converters adapted to multiply with binary numbers of a greater number of bits or digits by simply increasing the number of channels provided in the devices 11, 11', and 11".

While the invention has been described in connection with apparatus constituted of N-type conductivity substrates P-type conductivity substrates could as well be used. Of course, in such case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. A multiplying digital to analog converter for providing a sequence of samples in which each sample represents the product of a respective sample of an analog input signal and a respective binary number comprising:
   means for providing a binary number having a plurality of digits,
   means for providing an analog signal,
   a substrate of semiconductor material having a major surface,
   a plurality of first charge storage regions in said substrate adjacent said major surface, said first storage regions being consecutively arranged in a series according to the cross-sectional areas thereof as measured in a plane parallel to said major surface, the cross-sectional area of each storage region of the series starting with the second being twice the cross-sectional area of the preceding storage region of the series,
   a plurality of first storage electrodes, each associated with a respective storage region, each first storage electrode insulating overlying and coextensive with a respective first charge storage region,
   a plurality of first surface adjacent portions of said substrate, each conductively contiguous with a respective first charge storage region,
   a plurality of first control electrodes, each associated with a respective first surface adjacent portion, each first control electrode insulatingly overlying a respective first surface adjacent portion,
   said first storage regions being equal in number to the number of digits in said binary number, each first storage region being paired with a respective digit of said binary number with the first storage region having the smallest cross-sectional area being paired with the least significant digit and each successive first storage region of increased cross-sectional area being paired with a repsective successive digit of increased order,
   means for applying a first storage voltage to said first storage electrodes to establish a first level surface potential in said first storage regions,
   means for applying a first control voltage to said first control electrodes to establish a second level of surface potential in said first surface adjacent regions smaller in absolute magnitude than said first level of surface potential,
   means for applying said analog signal to one of said plurality of first storage electrodes and said plurality of first control electrodes to vary one of said first and second levels of surface potential while maintaining the other of said plurality of first storage electrodes and said plurality of first control electrodes fixed in potential,
   charge introduction means responsive to a "one" bit in each digit of said binary number to introduce a respective first quantity charge into respective first storage region, said first quantity of charge being proportional to the cross-sectional area of said first storage region and the difference of said first level of surface potential and said second level of surface potential,
   means for combining said first quantities of charge introduced into said first storage regions.

2. The converter of claim 1 in which said analog signal is applied to said plurality of first storage electrodes.

3. The converter of claim 1 in which said analog signal is applied to said plurality of first control electrodes.

4. The converter of claim 1 in which each of said first quantities of charge consists of the algebraic sum of a respective first fixed quantity of charge corresponding to the difference in said first and second levels of surface potential in the absence of analog signal and a quantity of analog signal related charge, said signal related charge having both positive and negative values, and in which is provided, a plurality of second charge storage regions in said substrate adjacent said major surface, said second storage regions being consecutively arranged in a second series according to the cross-sectional areas thereof as measured in a plane parallel to said major surface, the cross-sectional area of each storage region of the second series statring with the second being twice the cross-sectional area of the preceding storage region of the second series, each second charge storage region having the same cross-sectional area as a respective first charge storage region, a plurality of second storage electrodes, each associated with a respective storage region, each second storage electrode insulatingly overlying and coextensive with a respective second charge storage region, a plurality of second surface adjacent portions of said substrate, each conductively contiguous with a respective second charge storage region, a plurality of second control electrodes, each associated with a respective second surface adjacent portion, each second control electrode insulatingly overlying a respective second surface adjacent portion, said second storage regions being equal in number to the number of digits in said binary number, each second storage region being paired with a respective digit of said binary number with the second storage region having the smallest cross-sectional area being paired with the least significant digit and each successive second storage region of increased cross-sectional area being paired with a respective successive digit of increased order, means for applying a first storage voltage to said second storage electrodes to establish said first level of surface potential in said second storage regions, means for applying a second control voltage to said second electrodes to establish said second level surface potential in said second surface adjacent portions and in said second storage regions, means responsive to a "zero" in each of the digits of said binary number to introduce a respective second quantity of charge being proportional to the cross-sectional area of said second charge storage region and the difference of said first level of surface potential and said second level of surface potential, means for combining said second quantities of charge introduced into said second storage regions with said first quantities of charge introduced into said first storage regions.

5. A multiplying digital to analog converter for providing a sequence of samples in which each sample represents the product of a respective sample of an analog input signal and a respective binary number comprising means for providing a binary word consisting of a plurality of bits representing a binary number and an additional bit representing the sign of the binary number, means for providing an analog signal, a substrate of semiconductor material having a major surface, a plurality of first charge storage regions in said substrate adjacent said major surface, said first storage regions being consecutively arranged in a first series according to the cross-sectional areas thereof as measured in a plane parallel to said major surface, the cross-sectional area of each storage region of the first series starting with the second being twice the cross-sectional area of the preceding storage region of the first series, a plurality of first storage electrodes, each associated with a respective storage region, each first storage electrode insulatingly overlying and coextensive with a respective first charge storage region, a plurality of first surface adjacent portions of said substrate, each conductively contiguous with a respective first charge storage region, a plurality of first control electrodes, each associated with a respective first surface adjacent portion, each first control electrode insulatingly overlying a respective first surface adjacent portion, said first storage regions being equal in number to the number of digits in said binary number, each first storage region being paired with a respective digit of said binary number with the first storage region having the smallest cross-sectional area being paired with the least significant digit and each successive first storage region of increased cross-sectional area being paired with a respective successive digit of increased order, a plurality of second charge storage regions in said substrate adjacent said major surface, said second storage regions being consecutively arranged in a second series according to the cross-sectional areas thereof as measured in a plane parallel to said major surface, the cross-sectional area of each storage region of the second series starting with the second being twice the cross-sectional area of the preceding storage region of the second series, each second charge storage region having the same cross-sectional area as a respective first charge storage region, a plurality of second storage electrodes, each associated with a respective storage region, each second storage electrode insulatingly overlying and coextensive with a respective second charge storage region, a plurality of second surface adjacent portions of said substrate, each conductively contiguous with a respective second charge storage region, a plurality of second control electrodes, each associated with a respective second surface adjacent portion, each second control electrode insulatingly overlying a respective second surface adjacent portion, said second storage regions being equal in number to the number of digits in said binary number, each second storage region being paired with a respective digit of said binary number with the second storage region having the smallest cross-sectional area being paired with the least significant digit and each successive second storage region of increased cross-sectional area being paired with a respective successive digit of increased order, a plurality of third charge storage regions in said substrate adjacent said major surface, said third storage regions being consecutively arranged in a third series according to the cross-sectional areas thereof as measured in a plane parallel to said major surface, the cross-sectional area of each storage region of the third series starting with the second being twice the cross-sectional area of the preceding storage region of the third series, each third charge storage region having the same cross-sectional area as a respective first charge storage region, a plurality of third storage electrodes each associated with a respective storage region, each third storage electrode insulatingly overlying and coextensive with a respective third charge storage region, a plurality of third surface adjacent portions of said substrate, each conductively contiguous with a respective third charge storage region, a plurality of third control electrodes, each associated with a respective third surface adjacent portion, each third control electrode insulatingly overlying a respective third surface adjacent portion, said third storage regions being equal in number to the number of digits in said binary number, each third storage region being paired with a respective digit of said binary number with the third storage region having the smallest cross-sectional area being paired with the least significant digit and each successive third storage region of increased cross-sectional area being paired with a respective successive digit of increased order, means for applying a first storage voltage to said first, second and third storage electrodes to establish a first level of surface potential in said first, second and third storage regions, means for applying the sum of a second fixed voltage and said analog signal to said first control electrodes to establish a first variable surface potential smaller in absolute magnitude than said first level of potential in said first surface adjacent portions and in said first storage regions, means responsive to a positive sign bit and a "one" bit in each digit of said binary number to introduce a respective first quantity charge into a respective first storage region, said first quantity of charge being proportional to the cross-sectional area of said first storage region and the difference of said first variable surface potential and said first level of surface potential, means for applying the difference of said second fixed voltage and said analog signal to said third control electrodes to establish a third variable surface potential smaller in absolute magnitude than said first level of potential in said third surface adjacent portions and in said third storage regions, means responsive to a negative sign bit and a "one" bit in each digit of said binary number to introduce a respective third quantity charge into a respective third storage region, said third quantity of charge being proportional to the cross-sectional area of said third storage region and the difference of said third variable surface potential and said first level of surface potential, means for applying said second voltage to said second control electrodes to establish a second level of surface potential smaller in absolute magnitude than said first level of potential in said second surface adjacent portions and said second storage regions, means responsive to a "zero" in each of the digits of said binary number to introduce a respective second quantity of charge into a respective second storage region, said second quantity of charge being proportional to the cross-sectional area of said second charge storage region and the difference of said first level of surface potential and said second level of surface potential, means for combining the quantities of charge introduced into said first, second, and third storage regions.

* * * * *